United States Patent
Miller et al.

(12)

(10) Patent No.: US 6,559,513 B1
(45) Date of Patent: May 6, 2003

(54) FIELD-PLATE MESFET

(75) Inventors: Dain Curtis Miller, Roanoke, VA (US); Inder J. Bahl, Roanoke, VA (US); Edward L. Griffin, Roanoke, VA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/127,187

(22) Filed: Apr. 22, 2002

(51) Int. Cl.⁷ ................................................. H01L 29/80

(52) U.S. Cl. ...................................... 257/488; 257/280

(58) Field of Search ................................ 257/280, 282, 257/488, 408

(56) References Cited

U.S. PATENT DOCUMENTS 5,565,696 A * 10/1996 Miller et al. ................. 257/336
6,005,267 A * 12/1999 Griffin et al. ................ 257/280
6,100,571 A *  8/2000 Mizuta et al. ............... 257/488

\* cited by examiner

*Primary Examiner*—Mark V. Prenty

(57) ABSTRACT

A planar MESFET transistor includes a plurality of FET elements. Each FET element includes a doped planar channel, and source and drain coupled to the ends of the channel. A gate conductor extends over a portion of the channel at a location lying between the source and drain, a first predetermined distance from the drain. A field plate is connected to the gate conductor, and extends toward the drain a second predetermined distance, isolated from the channel except at its gate conductor connection by a dielectric material.

16 Claims, 6 Drawing Sheets

FIELD-PLATE MESFET

FIELD OF THE INVENTION

This invention relates generally to semiconductor devices and more particularly to Gallium Arsenide (GaAs) field-effect transistors (FETs).

BACKGROUND OF THE INVENTION

GaAs Metal-Semiconductor Field-Effect Transistors (MESFETS) are well known devices for providing amplification at microwave frequencies, high-speed digital switching, and various other functions. The use of microwave devices in satellite-based and wireless communications has grown in recent years. There is large market in such applications for MESFETs having very high power capability per unit transistor surface area, expressed in watts/mm$^2$. As the power capability or output of transistors improves, a single transistor can provide the power which in previous generations was provided by multiple transistors, which provides a cost, volume, and weight savings. The greater the power capability of a transistor, the broader its potential applications, and the larger the potential market. Thus, there has been a great deal of activity directed toward improving the performance of transistors for military, industrial and commercial applications.

A conventional GaAs MESFET uses a metal electrode in direct contact with a doped GaAs channel region to form a Schottky gate junction. A voltage applied to the gate electrode or junction influences the channel carrier density in the vicinity of the gate electrode, so that current flow from drain to source through the channel region, under the impetus of a drain-to-source voltage, can be modulated by variation of the voltage applied between the gate electrode and one of the other electrodes of the FET. This modulation or control is what allows the MESFET to provide its amplification and/or switching functions.

It has long been known that during the dynamic performance of an FET used in large-signal applications, the instantaneous source-to-drain voltage makes an excursion from a relatively high value to a small value, and that the associated instantaneous drain-to-source current makes an excursion in the opposite direction. In general, the maximum allowable drain-to source voltage must be limited so as not to exceed the breakdown voltage of the transistor. The breakdown voltage is determined by the structural parameters of the transistor, including such factors as the spacing between the gate electrode and the drain electrode. Other such parameters include the breakdown field of the substrate material itself, as for example germanium, silicon, gallium arsenide, diamond, and the like, the doping levels of the various portions of the structure, the dimensions of the doped portions, and the detailed shape of the gate electrode and adjoining material. The breakdown field of a material is related to its bandgap—this means that materials with larger bandgaps than GaAs would be helpful in realizing transistors with higher breakdown voltages. However, breakdown voltage is only one of the parameters which is important in producing a transistor for microwave and switching applications, since the operating speed of the device is equally, or possibly more important, as well as the amount of current which can be switched by a given size device.

A known approach to the fabrication of GaAs MESFETs is described in *A New Refractory Self-Aligned Gate Technology for GaAs Microwave Power FET's and MMIC's*, by Geissberger et al., published in IEEE Transactions on Electron Devices, Vol 35, No. 5, May 1988. As described therein, a gate electrode overlies the channel and forms a Schottky junction, asymmetrically located relative to the source and drain. In order to reduce resistance of the gate in a direction transverse to the direction of source-to-drain current, a titanium-gold (Ti/Au) overlay is placed over the gate electrode. The Ti/Au material is more conductive than the material of the gate electrode, and its transverse dimensions are also greater, so its resistance is much less than that of the gate electrode.

One approach to improving power capability of a high-power gallium-arsenide MESFET, attributable to burnout near pinchoff, involves the recessing of the gate electrode within a trough or depression in the GaAs channel region, but this method has little effect on breakdown during instantaneous open-channel conditions. The open-channel burnout was then found to be improved by extending the extent of the trough or depression on either side of the gate electrode. $[dcm1]$ The recessed gate is effective in increasing the power-handling capability of a GaAs MESFET, but requires more complex procedures during manufacture than might be desired for lowest cost.

Another approach to improving the power capability of a planar GaAs MESFET, without recourse to a recessed-gate structure, is described in U.S. Pat. No. 5,565,696, issued Oct. 15, 1996 in the, name of Miller et al. As described by Miller et al., the transistor includes an ion-implanted n−guard region surrounding the n+ drain electrode, to thereby decrease the likelihood of breakdown of the drain-to-substrate or drain-to-subchannel junction. This transistor also includes an oversize conductive plate overlying that portion of the gate electrode forming the Shottky junction, for reducing the resistance of the gate to drive signals.

Another approach is described in U.S. Pat. No. 6,005,267, issued Dec. 21, 1999 in the name of Griffin et al. As described by Griffin et al., it was known to increase the gate-to-drain breakdown voltage of a planar GaAs MESFET by increasing the spacing between the gate electrode and the drain. While effective at increasing the breakdown voltage, the additional length (in the source-to-drain conduction direction) of channel introduced additional resistance into the source-to-drain path, and this additional resistance, in turn, tended to limit the ON-state or maximum current. Thus, the increase in power capability which might have been allowed by the increased breakdown voltage was mitigated by the decrease in current capacity. The Griffin et al. solution to this problem was to add an additional insulated electrode on the channel at a location lying between the gate and the drain, and to apply a sample of the signal to be amplified or switched to this additional electrode to modulate the ON-state resistance, and thereby at least partially overcome the effects of the resistance of the channel. The sample of the signal which is applied to the additional electrode is produced by means of a power divider and impedance transformers.

An article entitled *Novel High Power AlGaAs/GaAs HFET with a Field-Modulating Plate Operated at 35 V Drain Voltage*, by Asano et al, and published by the IEEE in 1998, describes a recessed-gate MESFET with a field plate similar to the one described by Griffin et al. located in the recess.

Improved planar MESFET power handling capability is desired.

SUMMARY OF THE INVENTION

A gallium-arsenide MESFET (MEtal-Semiconductor Field-Effect Transistor)includes a source, a gate, and a drain.

The transistor comprises$_{[dcm2]}$ a substrate defining a planar surface, and a doped channel region in the planar surface of a given thickness. The channel region is elongated in the drain-to-source conduction direction and defines source and drain ends. An electrically conductive gate conductor defines upper and lower surfaces. The gate conductor overlies a portion of the channel region, and the gate conductor has its lower surface in contact with the channel region, to thereby form a Schottky junction. The gate conductor has first and second edges spaced apart in the source-drain conduction direction. According to an aspect of the invention, the second edge of the gate conductor is spaced about 1.8 microns from the drain end of the channel region. A source is electrically coupled to the source end of the channel region, and a drain is electrically coupled to the drain end of the channel region. The conductive electrodes of the source and/or drain may be directly connected to the channel, or they may be connected by means of intermediary semiconductor regions. Pursuant to a further aspect of the invention, an electrically conductive field plate is mechanically and electrically connected to the upper surface of the gate conductor. The field plate extends about 1.3 microns from the second edge of the gate conductor toward the second end of the channel region, and is electrically isolated from the channel region in regions other than that of the gate conductor. The electrical isolation is provided by an insulating substance having a thickness of about 100 nm and a dielectric constant ($\epsilon_R$) of about 5. In a particular embodiment, the insulating substance comprises silicon oxynitride (SiON). In another avatar, at least one of the source and drain comprises an n-doped semiconductor region. In a more particular version of this avatar, the n-doped semiconductor region is doped to about $10^{18}$ donors/cc. In yet another hypostasis of the invention, at least one of the source and drain further comprises an intrinsic semiconductor region.

A particularly advantageous objectification of the invention parallels first, second and third FET elements, with common drain structure for the first and second FET elements, and common source structure for the second and third FET elements.

DESCRIPTION OF THE INVENTION

Figure 1:
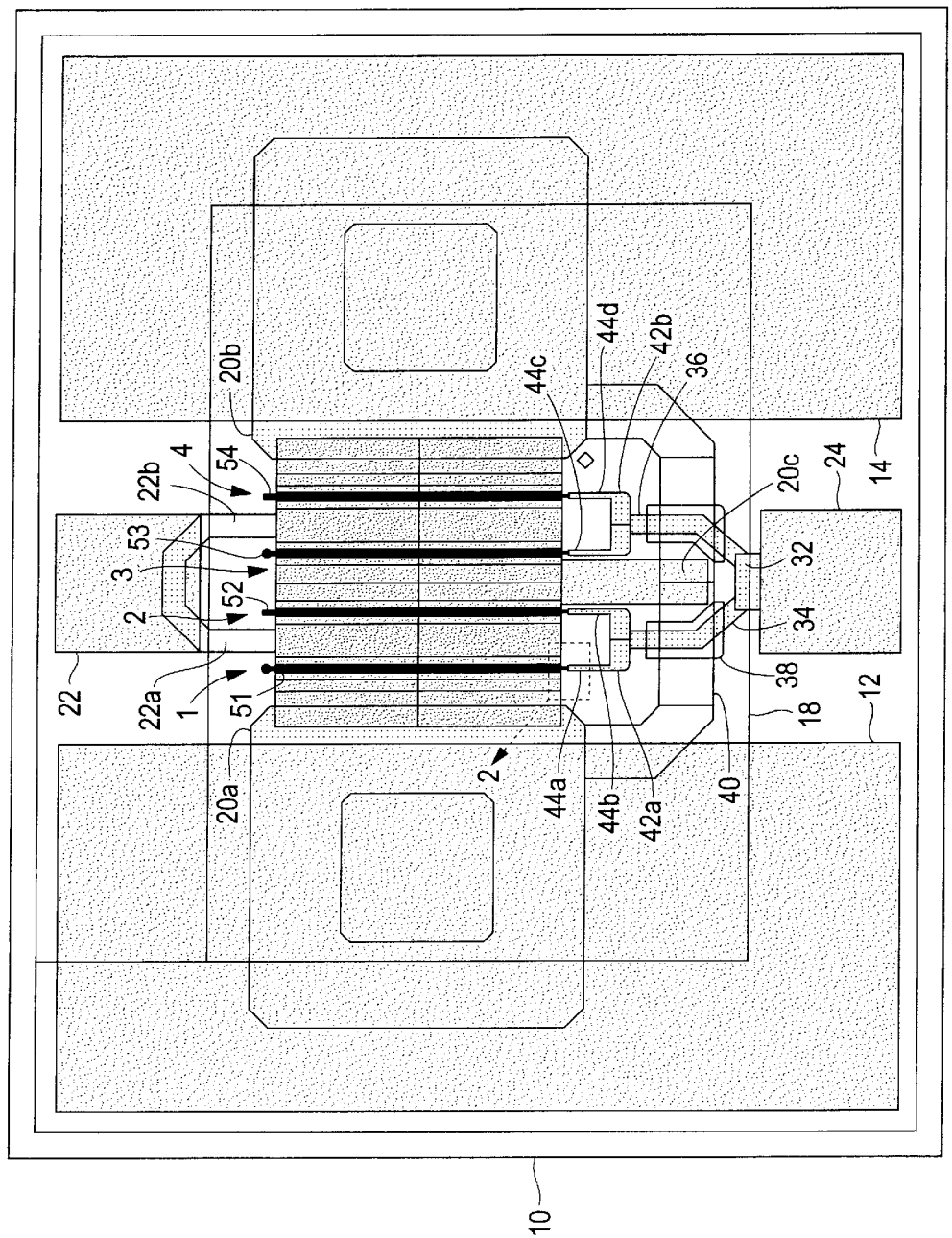
FIG. 1 is a simplified plan view of a planar GaAs field-plate MESFET according to an aspect of the invention.

FIG. 1 is a plan view of a planar transistor according to an aspect of the invention. In FIG. 1, the die on which the FET 8 is mounted is designated 10, and regions 12 and 14 represent ground planes used for on-wafer microwave measurements. Within regions 12 and 14, metallizations 20a, 20b, and 20c represent the source conductors, electrically coupled in parallel by means of conductive paths illustrated as 40. In FIG. 1, the drain electrode, contact, or bonding pad is designated 22, and the gate electrode, connection, or bonding pad is designated 24.

The FET 8 of FIG. 1 has four paralleled individual FET elements, which are designated 1, 2, 3, and 4, respectively. These individual FET elements are described in more detail in conjunction with FIG. 3.

In FIG. 1, the drain bonding pad 22 is connected by way of metallizations 22a and 22b with the drain region of the FET 8. The gate bonding pad 24 is connected by a metallization 32 and a concatenation of metallizations designated generally as 34 to a pair of power dividers or splitters 42a and 42b. Metallizations 34 may include wider and narrower portions for impedance transformation purposes, as known in the art. Power divider or splitter 42a receives the signal to be amplified from metallizations 34, and applies power or voltage to each of its associated gate electrodes 51 and 52, in equal amounts, by way of conductors 44a and 44b, respectively. Similarly, power divider or splitter 42b receives the signal to be amplified from metallizations 34, and applies power or voltage to each of its associated gate conductors 53 and 54 by way of conductors 44c and 44d, respectively.

Thus, it will be seen that each gate conductor 51, 52, 53, and 54 illustrated in FIG. 1 has a source region on one side, and a drain region on the other side. More particularly, FET element 1 has a gate conductor 51, to the left of which is a source conductor 20a, and to the right of which is a drain electrode 22a. FET element 2 has a gate conductor 52, to the left of which is the same drain electrode 22a, and to the right of which is source conductor 20c. Similarly, FET element 3 has a gate conductor 53, to the left of which is a source conductor 20c, and to the right of which is a drain electrode 22b. FET element 4 has a gate conductor 54, to the left of which is drain electrode 22b, and to the right of which is source conductor 20b. The structure is laid out in a manner which effectively parallels the four FET elements 1, 2, 3, and 4 to produce one overall or combined FET element.

In a FET, the electrical conduction is nominally from drain to source, which is a conduction direction which is transverse to the direction of elongation of the gate conductor 51, 52, 53, and 54.

Figure 2:
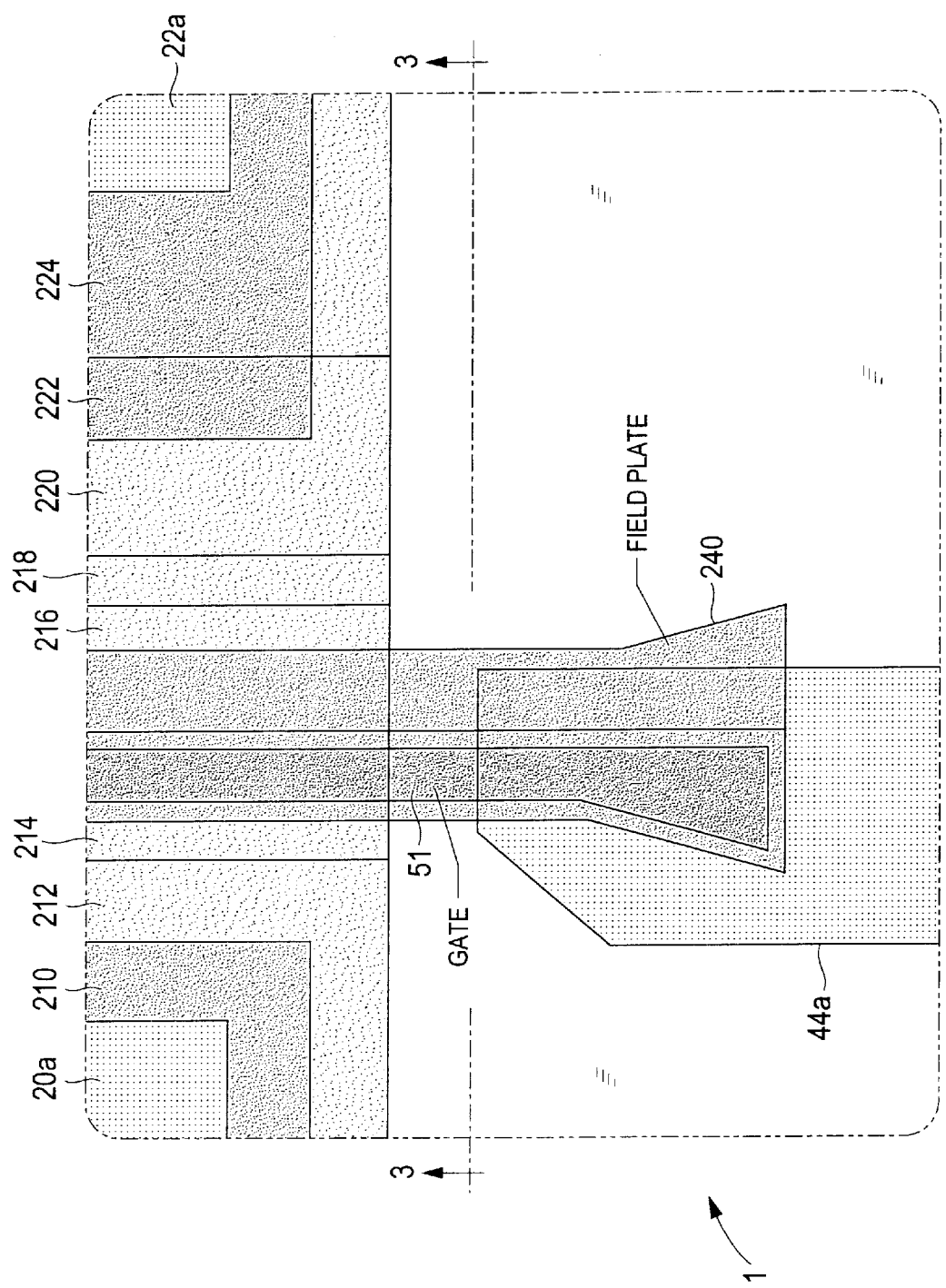
FIG. 2 is a simplified plan view of a portion of the structure of FIG. 1.

FIG. 2 is a simplified plan view of a portion of the structure of FIG. 1 at that end of gate conductor 51 adjacent conductor 44a. In FIG. 1, a field plate 240 extends parallel to and over gate conductor 51. Feed conductor 44a makes contact with both gate 51 and field plate 240. Region 20a is a portion of the source conductor, region 210 is underlying interconnect metal, region 212 is alloyed ohmic contact metal, region 214 is N+ GaAs, region 216 is channel-doped GaAs, region 218 is n− guard ring, region 220 is N+ GaAs, region 222 is underlying interconnnect metal, and region 224 is alloyed ohmic contact metal. Region 22a represents a portion of the drain conductor.

Figure 3:
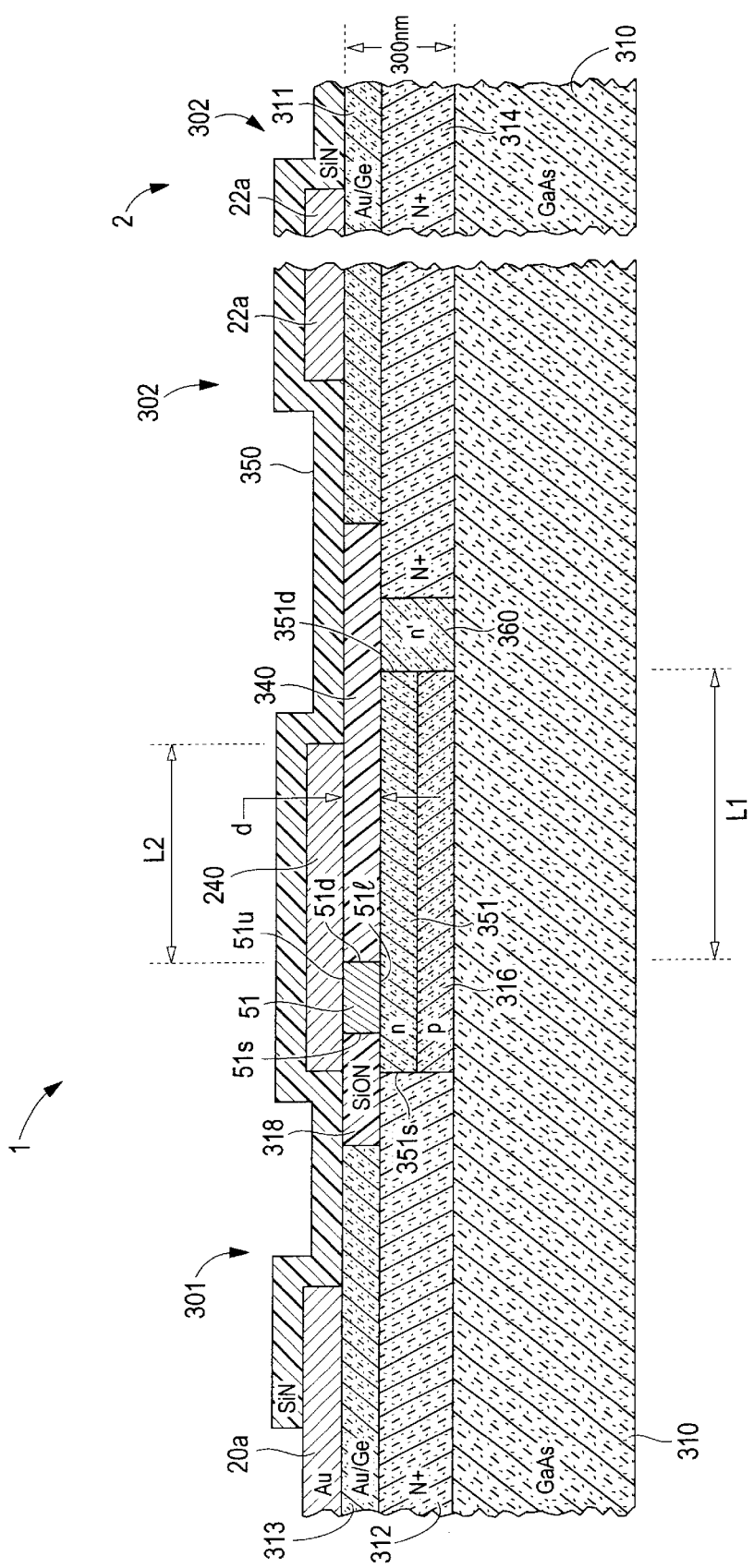
FIG. 3 is a cross-sectional view of the structure of FIG. 2 taken at section lines 3—3.

FIG. 3 is a cross-sectional view of the structure of FIG. 2 taken at section lines 3—3. The portion of the structure which is illustrated in FIG. 3 includes all of FET element 1, and a portion of FET element 2 of FIG. 1. While the upper surface of the structure of FIG. 3, designated generally as 310, appears to be irregular, the actual surface is very smooth and essentially planar. In FIG. 3, a GaAs substrate 310 has a doped subchannel region 316, and a doped channel region 351 within the subchannel region 316. Channel region 351 extends from a source end 351s at the left of FIG. 3 to a drain end 351d at the right. The drain, designated generally as 302, includes an n+ doped portion 314 and an n' guard portion 360 adjacent the drain end 351d of channel 351. A germanium-gold (Au/GE) drain material 311 overlies at least a portion of the n+ region 314 of drain 302. The drain metallization or conductor 22a overlies and makes ohmic contact with at least a portion of germanium-gold region 311 of the drain 302. The total thickness of layers 311 and 314 in one embodiment of the invention is 300 nanometers (nm). The source of FET element 1 of FIG. 3 is designated generally as 301, and includes an n+ doped portion 312 and an overlying germanium/gold (Au/Ge) portion 313. Gold (Au) conductor 20a overlies and makes conductive contact with layer 313 of source 301.

In FIG. 3, the gate conductor 51 overlies a portion of channel 351, and has its lower surface 511 in contact with the semiconductor channel 351 so as to form a Schottky junction. The gate conductor 51 is asymmetrically placed on the channel region 340, in that it lies closer to the source 301 than to the drain 302. A silicon oxynitride (SiON) dielectric isolation material 318 overlies that portion of the source n+ material 312 which is nearest the gate electrode 51, and also overlies that portion of the channel 351 lying between the gate electrode 51 and the germanium/gold layer 313, to thereby isolate the gate electrode 51 from the source 301. An electrically conductive field plate 240 is in mechanical and electrical contact with the upper surface 51u of gate conductor 51.

In the cross-sectional view of FIG. 3, the long dimension of gate conductor 51 and of the channel 351 extend into the Figure. The "length" of the channel 51 as illustrated in FIG. 3 extends parallel to the direction of drain-to-source current flow, which current flow is parallel to the direction of the arrows designated "L1" and "L2."

Electrically conductive field plate 240 of FIG. 3 extends to the right in the direction of source-to-drain current flow beyond that edge 51d of gate conductor 51 which is nearest the drain 302, and also extends to the left beyond that edge 51s of gate conductor 51 which is adjacent to or nearest the source 20a. That portion of field plate 240 which is not supported by gate conductor 51 overlies and is supported by a layer 318 of dielectric having a thickness designated as "d," which layer 318 of dielectric is itself supported by portions of n+ layer 312 of source 301, by channel 351, and by Au/Ge portion 311.

The entirety of the upper surface of that portion of the chip 10 of FIG. 1 which is illustrated in FIG. 3 is covered with a protective coating or layer 350 of dielectric material such as silicon nitride (SiN).

In FIG. 3, FET element 1 lies to the left of further FET element 2. Since drain 302 of FET element 1 is immediately adjacent FET element 2, the dimensions of the overall structure are reduced by using the same structural elements for the drains of both FET elements 1 and 2. Thus, that portion of FET element 2 which is visible in FIG. 3 includes a continuation of substrate 310, n+ doped portion 314, Au/Ge layer 311, and gate metallization 22a. This mirror-image layout of the FET chip as a whole allows each drain structure to be used for two separate or different, but mutually adjacent FET elements, thereby making "dual" use of each drain structure for minimizing the volume of a pair of FET elements, such as for example FET elements 1 and 2 of FIG. 1. In the same way, the source structure, associated with source conductor 20c and lying between gate conductors 52 and 53, allows "dual" use of the source structure for a pair of mutually adjacent FET elements, such as FET elements 2 and 3.

According to an aspect of the invention, the power per unit volume of the planar transistor of FIG. 1 is further improved or tends toward maximization by making the field-plate 240 projection toward the drain 302 dimension, designated L2 in FIG. 3, approximately 1.3 microns or micrometers, making the spacing between that edge 51d of the gate conductor 51 nearest the drain 302, which dimension is designated L1 in FIG. 3, approximately 1.8 ($\mu$m), and by making the thickness d of the SiON layer 340 equal to 100 nm. The dielectric constant of SiON is ~5, a dimensionless number. Naturally, the thickness of the dielectric material of layer 340 may be increased or decreased from that dimension, depending upon the dielectric constant of the material used in place of SiON.

Figure 4:
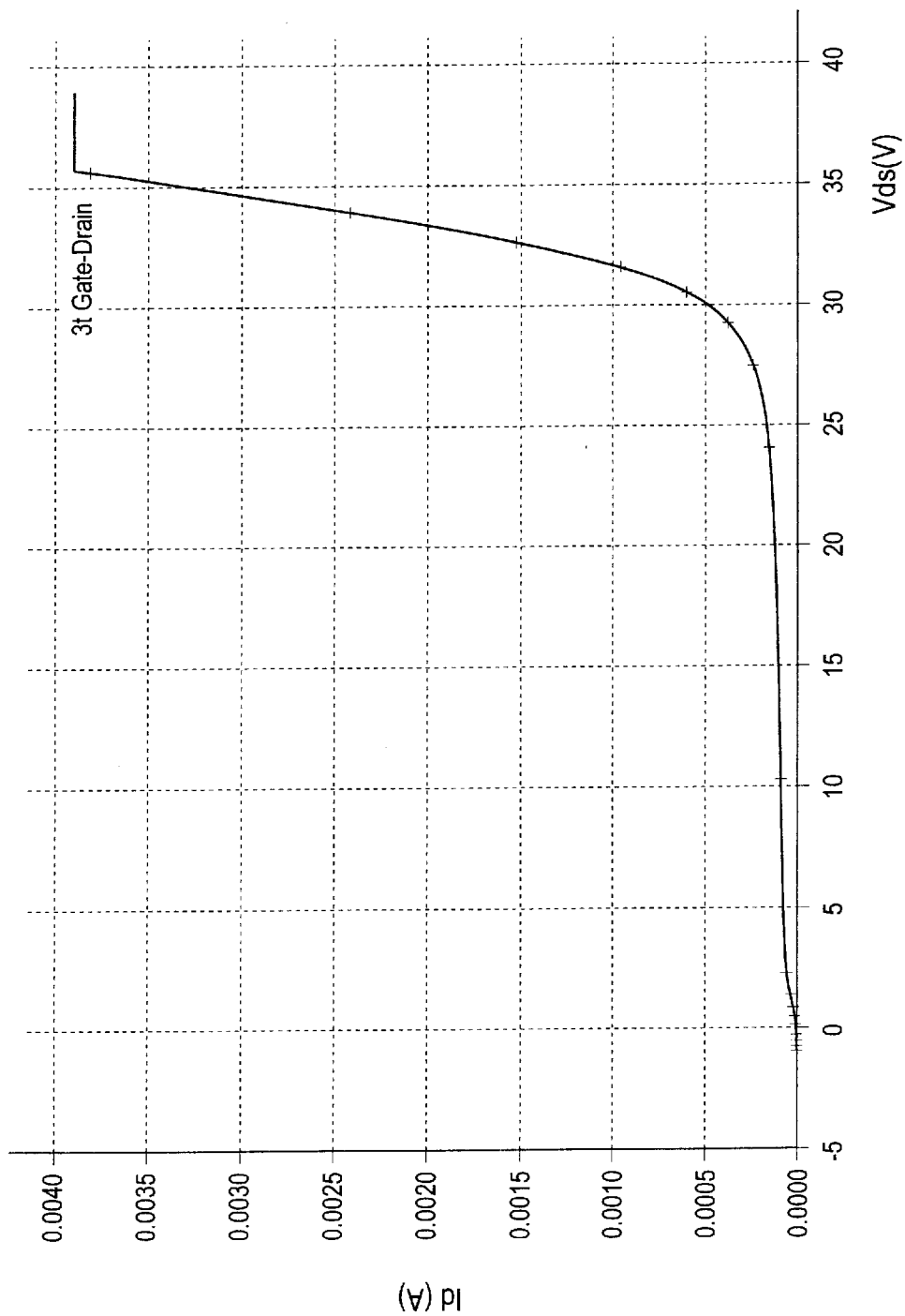
FIG. 4 is a plot of drain-to-source voltage of the structure of FIG. 1, illustrating the knee at which breakdown takes place.

FIG. 4 is a plot illustrating the drain current resulting from a voltage applied between the source and the drain of a preferred embodiment of a multielement FET as illustrated in FIGS. 1, 2, and 3, with a gate-to-source voltage of −4 volts applied. As illustrated, the plot of FIG. 4 shows a sharp break in the current in the vicinity of 30 to 35 volts, and either of these values may be deemed to be the breakdown voltage, depending upon what leakage current is considered to be acceptable. This voltage is higher than that of conventional planar GaAs MESFETS.

Figure 5:
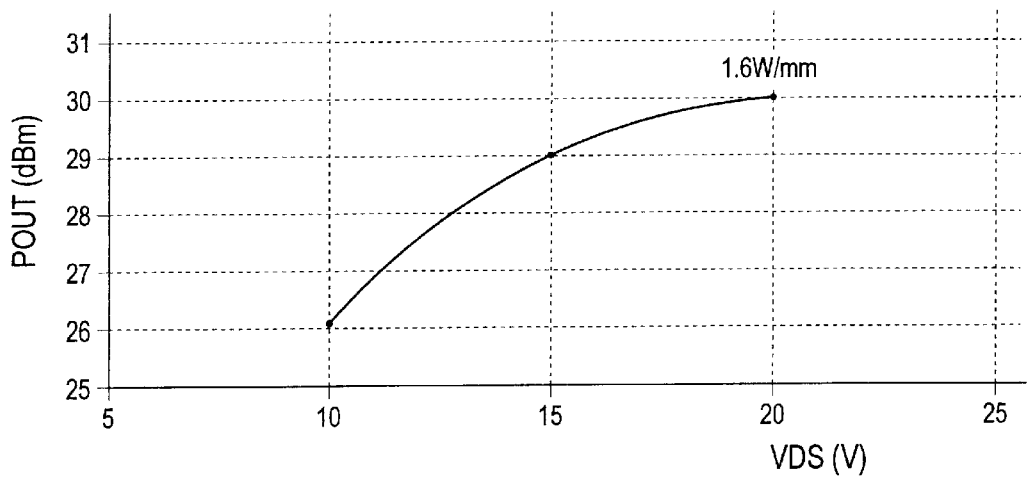
FIG. 5 is a plot of 3 GHz output power of the FET of FIG. 1, as a function of drain-to-source voltage.

FIG. 5 is a plot of output power in dBm at 3 GHz as a function of drain-to-source voltage (VDS) of the preferred embodiment. This preferred embodiment has an active surface area of about 0.625 square millimeters$_{[dcm10]}$. The gain at this frequency was 12 dB at VDS of 20 v, with an output power of +30 dBm, corresponding to 1 watt. At this power level, the transistor is producing about 1.6 watts per square millimeter of active surface area$_{[dcm11]}$, which is higher than is achieved by conventional planar MESFETs.

Figure 6:
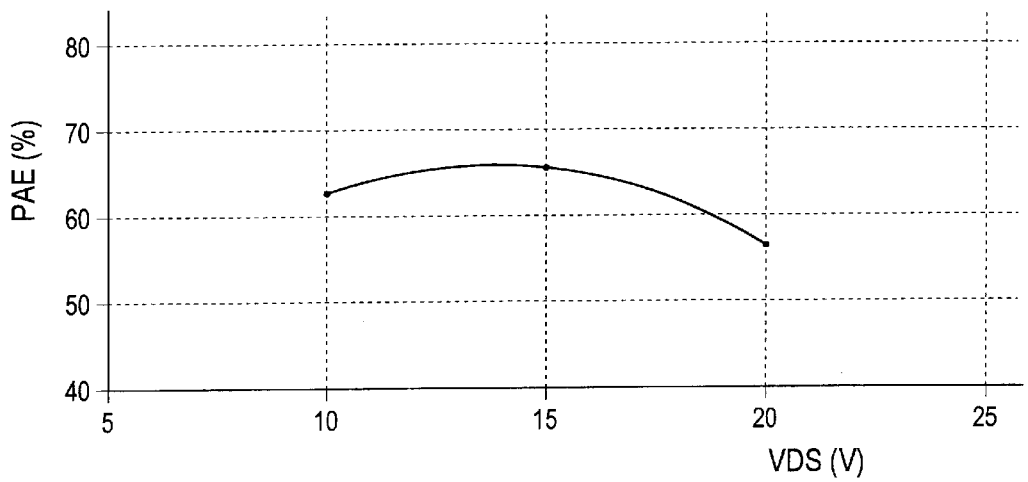
FIG. 6 is a plot of the efficiency at 3 GHz, as a function of drain-to-source voltage, with which power is converted from dc to microwaves in the transistor of FIG. 1.

FIG. 6 is a plot of power-added efficiency (PAE) in percent (%) at 3 GHz for a preferred embodiment of the invention. In FIG. 6, the PAE at 20 volts VDS is 58%, even at 20 volts, at which it also has a power density of 1.6 watts/mm, per FIG. 5.

Figure 7:
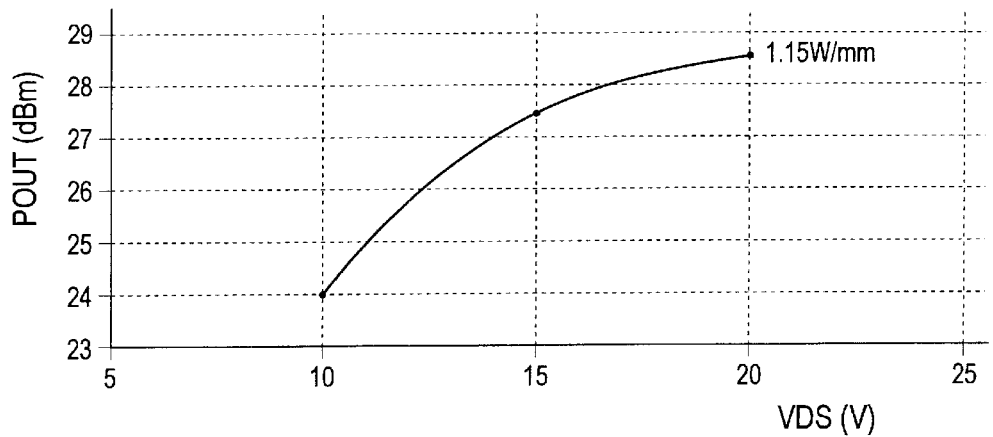
FIG. 7 is a plot of 10 GHz output power of the FET of FIG. 1, as a function of drain-to-source voltage.

FIG. 7 is a plot of output power similar to that of FIG. 5, but taken at 10 GHz rather than at 3 GHz. The gain at 10 GHz is 5 dB at VDS=20 V, and the output power is 28.6 dBm, corresponding to 1.15 w/mm.

Figure 8:
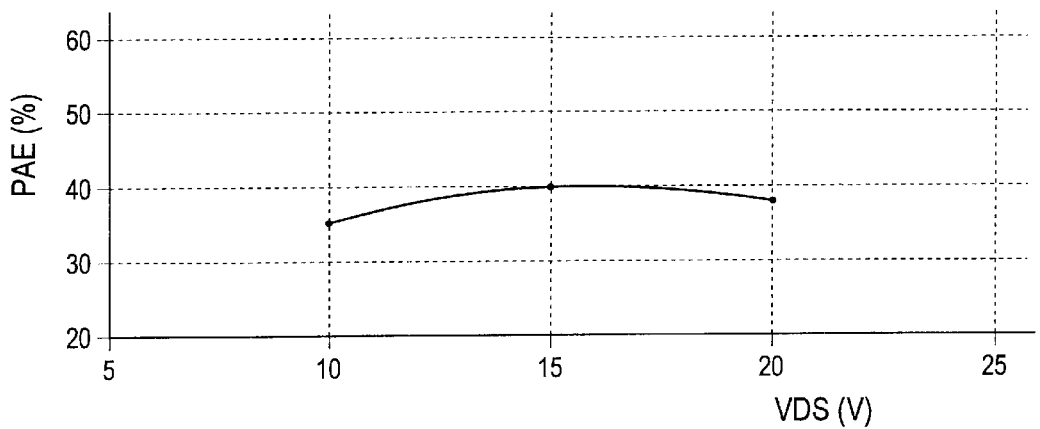
FIG. 8 is a plot of the efficiency at 10 GHz, as a function of drain-to-source voltage, with which power is converted from dc to microwaves in the transistor of FIG. 1.

FIG. 8 is a plot of power-added efficiency, similar to that of FIG. 6, but measured at 10 GHz rather than at 3 GHz. As illustrated, the PAE is in the range of 35% to 40%.

Other embodiments of the invention will be apparent to those skilled in the art. For example, while four FET elements have been illustrated and described in the multi-element FET, more or fewer than four elements may be used. While the connection of the source and drain metallizations or conductive portions 20 and 22, respectively, to the channel 351, has been illustrated as by way of intermediary doped regions, such as regions 312 andor 314, the source and/or drain conductive connections may be made directly to the end(s) of the channel 351, without doped or undoped intermediary semiconductor materials. The thickness and doping level of the channel may also be varied.

Thus, according to an aspect of the invention, a gallium-arsenide MESFET (10) includes a source (301), a gate (51, 351), and a drain (302). The transistor (10) comprises a semi-insulating gallium-arsenide substrate (310) defining a planar surface (301), and a channel region (351) in the planar surface (301) doped with 4×1017$^{17}$ donors/cc to a thickness of about 150 nm. The channel region (351) is elongated in a source-to-drain conduction direction (arrows L1 and L2) and defines source (351s) and drain (351d) ends. An electrically conductive gate conductor (51) defines upper (51u) and lower (51l) surfaces. The gate conductor (51) overlies a portion of the channel region (351), and the gate conductor (51) has its lower (51l) surface in contact with the channel region (351), to thereby form a Schottky junction. The gate conductor (51) has first (51s) and second (51d) edges spaced apart in the drain-source conduction direction, which first (51s) and second (51d) edges of the gate conductor (51)n are nearer to the source (351s) and drain (351d) ends of the channel region (351), respectively. The second edge (51d) of the gate conductor (51) is spaced 1.8 microns from the drain end (351d) of the channel region (351). A source or source electrode (301) is electrically coupled to the source end (351s) of the channel region (351), and a drain or drain electrode (302) is electrically coupled to the drain end (351d) of the channel region (351). The conductive electrodes (20a, 22a) of the source (301) andor drain (302) may be directly connected to the channel (351), or they may be connected by means of intermediary semiconductor regions (312; 314, 360). An electrically conductive field plate (240) is mechanically and electrically connected to the upper (51u) surface of the gate conductor (51). The field plate (240) extends about 1.3 microns from the second edge (51d) of the gate conductor (51) toward the second end (351d) of the channel region (351), and is electrically isolated (by dielectric 318) from the channel region (351) in regions other than that of the gate conductor (51). The electrical isolation is provided by an insulating substance having a thickness of about 100 nm and a dielectric constant ($\epsilon_R$) of about 5. In a particular embodiment, the insulating substance comprises silicon oxynitride (SiON). In another avatar, at least one of the source (301) and drain (302) electrodes comprises an n-doped semiconductor region (312; 314). In a more particular version of this avatar, the n-doped semiconductor region is doped to about $10^{18}$ donors/cc. In yet another hypostasis of the invention, at least one of the source (301) and drain (302) electrodes further comprises an intrinsic semiconductor region (360).

A particularly advantageous objectification of the invention is a multielement transistor (10) which parallels first (1), second (2) and third (3) FET elements, with common drain structure (302) for the first (1) and second (2) FET elements, and common source structure (20c) for the second (2) and third (3) FET elements.

What is claimed is:

1. A MESFET transistor including source, gate, and drain structures, said transistor comprising:
   a substrate defining a planar surface;
   a doped channel region in said planar surface, said channel region being elongated in a source-to-drain conduction direction and defining source and drain ends;
   an electrically conductive gate conductor defining upper and lower surfaces, said gate conductor having first and second edges spaced apart in said source-drain conduction direction, which first and second edges of said gate region are nearer to said source and drain ends of said channel region, respectively, said second edge of said gate conductor being spaced about 1.8 microns from said drain end of said channel region;
   a source electrically coupled to said source end of said channel region;
   a drain electrically coupled to said drain end of said drain region;
   an electrically conductive field plate connected to said upper surface of said gate conductor and extending about 1.3 microns from said second edge of said gate conductor toward said drain end of said channel region.

2. A transistor according to claim 1, wherein a dielectric layer is disposed between the channel region and field plate.

3. A transistor according to claim 2, wherein said dielectric layer comprises silicon oxynitride (SiON) dielectric.

4. A transistor according to claim 1, wherein the doped channel region comprises an n-doped concentration of about 4×10E17/donors/cc.

5. A transistor according to claim 1, wherein the channel region has a thickness of about 150 nm.

6. A transistor according to claim 1, wherein at least one of said source and drain comprises an n-doped semiconductor region.

7. A transistor according to claim 6, wherein said n-doped semiconductor region is doped to about $10^{18}$ donors/cc.

8. A transistor according to claim 6, wherein said at least one of said source and drain further comprises one of a lightly-doped and intrinsic guard ring semiconductor region.

9. A transistor according to claim 1, wherein the substrate comprises a semi-insulating gallium-arsenide substrate.

10. A multielement MESFET comprising first, second, and third FET elements, each of said first, second, and third FET elements including source, gate, and drain electrodes, defined on a planar substrate, each said FET element comprising:
    a doped channel region formed in said planar substrate to a given thickness, said channel region being elongated in a source-to-drain conduction direction and defining source and drain ends;
    an electrically conductive gate conductor defining upper and lower surfaces, said gate conductor overlying a portion of said channel region, said gate conductor having first and second edges spaced apart in said source-drain direction, which first and second edges of said gate region are nearer to said source and drain ends of said channel region, respectively, said second edge of said gate conductor being spaced about 1.8 microns from said drain end of said channel region;
    a source electrically coupled to said source end of said channel region;
    a drain electrically coupled to said drain end of said drain region;
    an electrically conductive field plate mechanically and electrically connected to said upper surface of said gate conductor, said field plate extending about 1.3 microns from said second edge of said gate conductor toward said drain end of said channel region, wherein:
       the drain of said first FET element is common with the drain of said second FET element; and
       the source of said second FET element is common with the source of said third FET element.

11. A multielement MESFET according to claim 10, wherein the substrate comprises a semi-insulating GaAs substrate.

12. A multielement MESFET according to claim 10, wherein the first and second edges of said gate region are nearer to said source and drain ends of said channel region, respectively.

13. A multielement MESFET according to claim 10, wherein a dielectric layer is disposed between the channel region and field plate.

14. A multielement MESFET according to claim 13, wherein said dielectric layer comprises silicon oxynitride (SiON) dielectric.

15. A multielement MESFET according to claim 10, wherein the doped channel region comprises an n-doped concentration of about 4×10E17/donors/cc.

16. A MESFET transistor including source, gate, and drain structures, said transistor comprising:

a substrate defining a planar surface;

a doped channel region in said planar surface, said channel region being elongated in a source-to-drain conduction direction and defining source and drain ends;

an electrically conductive gate conductor defining upper and lower surfaces, said gate conductor overlying a portion of said channel region, said gate conductor having first and second edges spaced apart in said source-drain direction, said second edge of said gate conductor being spaced about 1.8 microns from said drain end of said channel region;

a source electrically coupled to said source end of said channel region;

a drain electrically coupled to said drain end of said drain region; and an electrically conductive field plate connected to said upper surface of said gate conductor and extending about 1.3 microns from said second edge of said gate conductor toward said drain end of said channel region.

* * * * *